United States Patent
Yang et al.

(10) Patent No.: US 11,968,904 B2
(45) Date of Patent: Apr. 23, 2024

(54) FLEXIBLE PIEZOCERAMIC COMPOSITES AND METHOD FOR FABRICATING THEREOF

(71) Applicant: City University of Hong Kong, Hong Kong (HK)

(72) Inventors: Zhengbao Yang, Hong Kong (HK); Ying Hong, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 556 days.

(21) Appl. No.: 17/367,454

(22) Filed: Jul. 5, 2021

(65) Prior Publication Data

US 2022/0006003 A1 Jan. 6, 2022

Related U.S. Application Data

(60) Provisional application No. 63/048,216, filed on Jul. 6, 2020.

(51) Int. Cl.
*H01L 41/18* (2006.01)
*H10N 30/06* (2023.01)
*H10N 30/85* (2023.01)
*H10N 30/87* (2023.01)

(52) U.S. Cl.
CPC .......... *H10N 30/852* (2023.02); *H10N 30/06* (2023.02); *H10N 30/87* (2023.02)

(58) Field of Classification Search
CPC ........................ H10N 30/852; H10N 30/857
USPC .................................... 310/358, 800
See application file for complete search history.

(56) References Cited

PUBLICATIONS

Mengying Xie et al., "Flexible and Active Self-Powered Pressure, Shear Sensors Based on Freeze Casting Ceramic-Polymer Composites", Energy & Environmental Science, 2018.
Guangzu Zhang et al., "Flexible three-dimensional interconnected piezoelectric ceramic foam based composites for highly efficient concurrent mechanical and thermal energy harvesting", Energy & Environmental Science, Apr. 10, 2018.
Yong Zhang et al., "Bioinspired elastic piezoelectric composites for high-performance mechanical energy harvesting", Journal of Materials Chemistry A, Jun. 20, 2018.

*Primary Examiner* — Derek J Rosenau
(74) *Attorney, Agent, or Firm* — Idea Intellectual Limited; Margaret A. Burke; Sam T. Yip (57) ABSTRACT

The present invention provides a flexible piezoelectric composite including a three-dimensional interconnected piezoelectric ceramic framework based on a porous organic template with sufficient stiffness and infiltrated with a flexible polymer matrix. A method for fabricating the flexible piezoelectric composition is also described herein.

20 Claims, 10 Drawing Sheets

FLEXIBLE PIEZOCERAMIC COMPOSITES AND METHOD FOR FABRICATING THEREOF

CROSS-REFERENCE WITH RELATED APPLICATIONS

The present application claims priority from the U.S. Provisional Patent Application No. 63/048,216 filed Jul. 6, 2020, and the disclosure of which is incorporated herein by reference in its entirety.

FIELD OF THE INVENTION

The present invention relates to a piezoceramic composite. In particular, the present invention relates to a flexible piezoelectric composite including a three-dimensional interconnected piezoelectric ceramic framework based on a porous organic template with sufficient stiffness and infiltrated with a flexible polymer matrix.

BACKGROUND

Piezoelectric effect is the induction of an electric charge in response to an applied mechanical strain, which can be used to convert mechanical energy into electrical energy. As a result, piezoelectric materials have been widely used to scavenge energies from environment and body movement to power personal electronics, nanodevices and wireless sensors, etc. To extend the application fields of piezoelectric materials, good mechanical flexibility is often considered to be the supplementary requirement. However, bulk piezoelectric ceramics such as PZT have high piezoelectric coefficients but low flexibility, while piezoelectric polymers such as PVDF have good flexibility but relatively low piezoelectric coefficients.

Among all of the piezocomposite, the connectivity of the structural components enables to form a micro-geometric image of the piezoelectric composite. The distribution of a component with a self-connected state can take place along zero, one, two or three coordinate axes, such as connectivity $\alpha=0$, 1, 2 or 3 for the component 1 and connectivity $\beta=0$, 1, 2 or 3 for the component 2. The connectivity of a two-component composite is written as $\alpha$-$\beta$, where the connectivity of the piezoelectric component takes the first position ($\alpha$).

In traditional ceramic-polymer composites, the polymer matrix is mixed with randomly dispersed low-dimensional piezoelectric ceramic fillers including 0D ceramic nanoparticles, 1D ceramic nanowires/fibers, 2D nanosheets. These composite materials take advantage of the flexibility from the polymer matrix and piezoelectricity from the ceramic fillers. However, the low-dimensional nanostructures are both ineffective for energy harvesting with limited piezoelectricity and mechanical flexibility with discontinuous stiffness. The randomly dispersed low-dimensional ceramic fillers severely influence the stiffness continuity and stress transfer, leading to severe degeneration of the piezoelectricity and flexibility.

Among all of the flexible piezoelectric materials, piezoelectric foam composite as a new flexible piezoelectric material with 3-D interconnected ceramic framework has attracted great attention due to its excellent mechanical and piezoelectric performance compared to the traditional ceramic-polymer composites with randomly dispersed low-dimensional ceramic fillers. The unique 3-D interconnected architecture in the piezoelectric composite significantly improves the effective load transfer from external loading forces to the internal piezoceramic framework. The combination effect of multiple deformations in the piezoceramic framework, including compression, flexure, and twist, further augment the power output under various deformation modes.

Zhang et al. (2018) ("Flexible three-dimensional interconnected piezoelectric ceramic foam based composites for highly efficient concurrent mechanical and thermal energy harvesting", *Energy & Environmental Science*, 11(8), 2018, pages 2046-56) provided a scalable ceramic-polymer composites based on 3-D interconnected piezoelectric microfoams. Comprehensive mechanics analyses reveal that their 3-D interconnected structure creates a continuous pathway for load transfer to improve the load transfer as compared to other composites with low-dimensional ceramic fillers. The 3-D composite of Zhang et al. exhibits excellent piezoelectric characteristics under various loading conditions, e.g., stretching, compression and bending, and good mechanical durability through thousands of cycles. However, using PU template in Zhang et al. leads to about 150% shrinkage, which also results in more cracks because of the large extent of shrinkage. The large volume shrinkage in Zhang et al. is mainly the result of using a low ratio of piezoelectric materials, and also due to a large modulus difference between the piezoelectric materials and the polymer matrix based on a single polymer. These drawbacks not just contribute to large volume shrinkage, but also leads to poor mechanical and piezoelectric properties.

Another Zhang et al. (2018) ("Bioinspired elastic piezoelectric composites for high-performance mechanical energy harvesting", *Journal of Materials Chemistry* A, 6(30), 2018, pages 14546-14552) provided the sea sponge-inspired design and piezoelectric composite generators (PCGs) preparation based on a three-dimensional electroceramic skeleton. The open-circuit voltage, short-circuit current density and matching power density of the bioinspired PCG displays 30 times higher strain-voltage conversion efficiency under the condition of stretching than the state-of-the-art performance of the conformable piezoelectric energy harvesters reported so far.

Xie et al. (2018) ("Flexible and active self-powered pressure, shear sensors based on freeze casting ceramic-polymer composites" *Energy & Environmental Science*, 11(10), 2018, pages 2919-2927, provided a self-powered flexible pressure and shear sensors based on freeze casting ceramic-polymer composite. A lamellar lead zirconate titanate (PZT) framework is fabricated by freeze-casting, and then polydimethylsiloxane (PDMS) is filled into the aligned pore channels, forming the piezoelectric composites. The structured PZT-PDMS composites presents a highly effective longitudinal piezoelectric coefficient ($d_{33}$*) of 750 pCN$^{-1}$, higher than that of the bulk ceramic because of the combination of bending and flexural effects. The drawback is that freeze-casting method is difficult to adjust patterns and pore size of the composites, which limits its application.

In addition, none of the foregoing references provide a flexible piezoelectric composite with sufficient mechanical strength for most of the consumer electronics or specialized electronic devices which normally require durability, stiffness but also certain bendability. Therefore, there is an unmet need for such a composite in these fields.

SUMMARY OF THE INVENTION

To address the aforementioned shortcomings, the present invention provides a flexible, three-dimensional piezoelectric composite including a three-dimensional interconnected ceramic framework with a porous organic template selected from wood, paper, textile, or bamboo, which significantly improves the stress transfer and piezoelectric property, as a result of the increased connectivity of the piezo ceramic phase. Moreover, the stiffness continuity, attributed to the interconnected ceramic phase, dramatically reduces the equivalent Young's modulus of the piezoelectric composite. Besides, the addition of PZT powders into the PZT sol solutions in the present preparation method improves the density of effective piezoelectric materials compared with the methods based on conventional PZT sol solutions. The various organic templates provide the piezoelectric composites with customizable b 3D interconnected ceramic frameworks, which allows the piezoelectric composites to have anisotropic piezoelectric responses under different forces. The anisotropic piezoelectricity allows the present composite to be used in different devices/sectors including but not limited to flexible sensors, energy harvester, and for actuation of soft robotics, etc.

In a first aspect, the present invention provides a flexible, piezoelectric composite including:
  a polymer matrix including at least two polymers and having a low Young's modulus of less than 10 MPa and a permittivity of less than 10;
  a porous organic template selected from paper, textile, wood, bamboo, or any organic template having a relatively permittivity of 500 to 7,000 and average pore size of about 10 to 300 μm filled with at least one surface-modified piezoelectric element to form a three-dimensional interconnected ceramic framework such that said polymer matrix after being subject to sintering followed by curing forms a ceramic-polymer composite with equal to or less than 50% volume shrinkage with respect to initial volume of the three-dimensional interconnected ceramic framework and the polymer matrix before said sintering and curing;
  at least a pair of electrodes sandwiching the ceramic-polymer framework and subsequently stacking a protective layer on each of the pair of electrodes,
  wherein one of the at least two polymers in the polymer matrix is relatively less stiff than the other such that the relatively less stiff polymer serves as an elastic filler whereas the relatively stiffer polymer serves as a mechanical support of the ceramic-polymer framework, and
  wherein the flexible, piezoelectric composite is configured to receive an electric field greater than coercive field of the three-dimensional interconnected ceramic framework so as to remain the composite piezoelectrically active.

In one embodiment, the three-dimensional interconnected ceramic framework to the polymer matrix after sintering is in a mass ratio of more than 2:1. For example, the mass ratio can be 3:1, 4:1, 5:1, 5:2, or higher.

In one embodiment, the flexible, piezoelectric composite has an elastic modulus of less than 20 MPa.

In one embodiment, the flexible, piezoelectric composite has a thickness of more than 100 μm.

In one embodiment, the flexible, piezoelectric composite has a 3-3 connectivity pattern.

In one embodiment, the relatively less stiff polymer of the at least two polymers of the polymer matrix includes polydimethylsiloxane (PDMS), ECOFLEX and other silicon elastomers. In a preferred embodiment, the relatively less stiff polymer is PDMS.

In one embodiment, the relatively stiffer polymer of the at least two polymers of the polymer matrix includes polyvinylidene fluoride (PVDF), polyimide (PI) and epoxy. In a preferred embodiment, the relatively stiffer polymer is PVDF.

In one embodiment, the at least one piezoelectric element of the three-dimensional interconnected ceramic framework includes lead-based piezoelectric ceramics such as lead zirconate titanate (PZT), $BaTiO_3$ (BTO), zinc oxide (ZnO), piezoelectric single crystals such as lead magnesium niobite-lead titanate (PMN-PT), $LiNbO_3$ (LN), and [111]-oriented tetragonal $Pb(In_{1/2}Nb_{1/2}O_3)$—$Pb(Mg_{1/3}Nb_{2/3}O_3)$—$PbTiO_3$ (PIN-PMN-PT).

In a further embodiment, molar ratio of Pb:Zr:Ti in PZT is 1:0.52:0.48.

In a second aspect, the present invention provides a method of fabricating the flexible piezoelectric composite of the present invention, and devices including the present composite. The method of fabricating the flexible piezoelectric composite including:
  providing a sol solution of piezoelectric element;
  providing surface-modified piezoelectric element powders;
  mixing the sol solution and the surface-modified piezoelectric element powders in a ratio such that a well-dispersed suspension of piezoelectric element mixture is obtained;
  adding the well-dispersed suspension of piezoelectric element mixture dropwise to a porous organic template selected from wood, paper, textile, bamboo, or any organic template having a relatively permittivity of 500 to 7,000 and average pore size of about 10 to 300 μm until the porous organic template is substantially immersed into the suspension of piezoelectric element mixture;
  drying the suspension such that the sol immersed into the pores of the organic template is converted into a gel;
  sintering the dried organic template dispersed with the piezoelectric element to obtain a three-dimensional interconnected piezoelectric-ceramic framework;
  providing and adding a solution of a relatively stiffer polymer, e.g., polyvinylidene fluoride, on the three-dimensional interconnected piezoelectric-ceramic framework followed by drying to form a coating of polyvinylidene fluoride on the framework;
  providing a solution of a relatively less stiff polymer, e.g., polydimethylsiloxane, and adding thereof on the surface of the polyvinylidene fluoride-coated three-dimensional interconnected piezoelectric-ceramic framework until the three-dimensional interconnected piezoelectric-ceramic framework is fully infiltrated with the solution of polydimethylsiloxane;
  curing the three-dimensional interconnected piezoelectric-ceramic framework fully infiltrated with the solution of polydimethylsiloxane to obtain a piezoelectric ceramic-polymer composite.

In one embodiment, the sol solution of piezoelectric element is provided by mixing a sol solution of piezoelectric element having a final formula of $Pb(Zr_{0.52}Ti_{0.489})O_3$ with lead (II) acetate trihydrate, acetic acid, zirconium (IV) propoxide and titanium (IV) butoxide as the starting materials, where the lead (II) acetate trihydrate is added in at least 20% excess by mass into the acetic acid under vigorous stirring at 70° C. until the lead (II) acetate trihydrate is fully dissolved, followed by cooling to room temperature and adding zirconium (IV) propoxide and titanium (IV) butoxide dropwise into the solution of lead (II) acetate trihydrate in acetic acid under stirring. To assist dissolution and avoid aggregation during the stirring, ultrasonic processing is applied to the mixture under stirring.

In a preferred embodiment, the sol solution of piezoelectric element has a final concentration of 2M with a molar ratio of lead:zirconium:titanium in 1.2:0.52:0.48.

In one embodiment, the surface-modified piezoelectric element powders are provided by adding piezoelectric element powders such as PZT powders into distilled water followed by adding polyethyleneimine (PEI) dropwise into the distilled water containing the piezoelectric element powders under stirring. The surface-modified piezoelectric powders are obtained by centrifuging the mixture of PZT powders and PEI, collecting the solid phase after centrifugation, washing the collected solid phase several times.

In one embodiment, the sol solution and the surface-modified piezoelectric element powders are mixed in 1:1 mass ratio.

In one embodiment, the drying of the well-dispersed suspension of piezoelectric element mixture dropwise to a porous organic template is at about 60° C. and for an hour until the sol is converted into the gel.

In one embodiment, the sintering is at about 1,000° C. and for two hours under atmospheric pressure.

In one embodiment, the curing is at about 70° C. and for about two hours.

The present method further includes sandwiching at least two electrodes each on each surface of the piezoelectric ceramic-polymer composite according to an embodiment of the present invention, followed by stacking a protective layer on each of the at least two electrodes to form an assembly in order to obtain a flexible, piezoelectric composite of the present invention.

In one embodiment, a layer of silver film is coated onto each of the surfaces of the piezoelectric ceramic-polymer composite as the electrode. Preferably, the coating of the silver film on the surface of the piezoelectric ceramic-polymer composite is by sputtering.

In another embodiment, a layer of polydimethylsiloxane film is further coated on the silver film. Preferably, the coating of the polydimethylsiloxane on the silver film is by spin-coating.

In other embodiment, the assembly is subject to polarization followed by cooling to room temperature.

In yet another embodiment, the polarization is at 85° C. and for one hour.

Other aspects of the present invention include article incorporating the flexible piezoelectric composite described herein or the piezoelectric composite fabricated according to the fabrication method described herein, and the article includes but not limited to energy harvester, pressure sensor, actuators, soft robots, any wearables or portable devices requiring flexibility and anisotropic piezoelectricity.

BRIEF DESCRIPTION OF THE DRAWINGS

Embodiments of the invention are described in more details hereinafter with reference to the drawings, in which.

DETAILED DESCRIPTION OF THE INVENTION

In the following description, the composite, articles, fabrication methods thereof, and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

It should be apparent to practitioner skilled in the art that the foregoing examples of the system and method are only for the purposes of illustration of working principle of the present invention. It is not intended to be exhaustive or to limit the invention to the precise forms disclosed.

EXAMPLE

Figure 1:
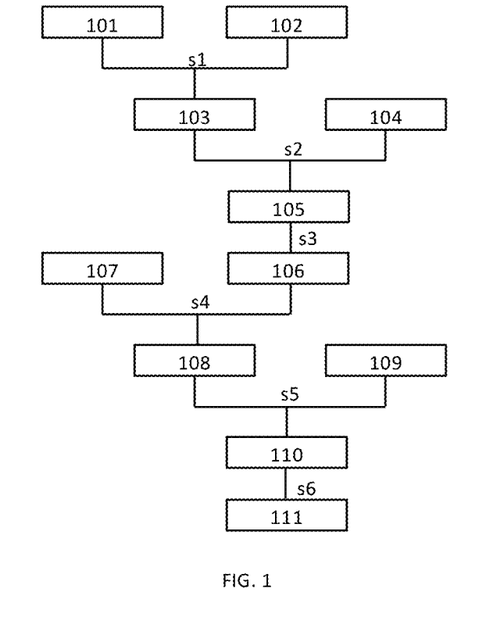
FIG. 1 depicts an embodiment of the present invention to manufacture the present piezoelectric composite.

The present flexible piezoelectric composites with 3-D interconnected ceramic framework based on the template of paper, textile, wood and bamboo using PZT sol solutions mixed with PZT powders is provided according to the following described fabrication method and characterizations:

As shown in FIG. 1, the fabrication method generally includes:

1) Preparing a PZT [Pb(Zr$_{0.52}$Ti$_{0.48}$)O$_3$] sol solution (101) from lead (II) acetate trihydrate, acetic acid, zirconium (IV) propoxide and titanium (IV) butoxide as the starting material: The lead (II) acetate trihydrate with a 20% excess by mass is mixed with acetic acid under vigorous stirring at 70° C. until the solid is fully dissolved. After cooling to room temperature, the zirconium (IV) propoxide and titanium (IV) butoxide are dropped slowly into the solution under stirring. Ultrasonic processing is then used to dissolve the possible aggregates formed during the mixing. The concentration of the final solution is 2M, with a molar ratio of Pb:Zr:Ti=1.2:0.52:0.48. An excess of 20% Pb is used to compensate the lead loss due to its high volatilization at high temperature.

2) Preparing surface modified PZT powders (102): PZT powders are first dispersed in distilled water. Polyethyleneimine (PEI) solution is added dropwise to the dispersed PZT solution and the mixture is stirred for 1 h. After stirring, the surface modified PZT powders are separated by centrifugation, and the excess PEI solution is washed away with distilled water. After washing three times with ethanol to remove the distilled water, the surface modified PZT powders are obtained by centrifugation.

3) Mixing the prepared PZT sol solutions with modified PZT powders (s1) (in 1:1 mass ratio): After stirring for 1 hour, the well dispersed mix suspensions (103) are obtained.

4) Fabricating porous b 3D interconnected ceramic framework: The prepared mixed PZT suspensions obtained from (3) are dropped onto porous organic template (104), e.g., a paper, textile, wood, or bamboo template, until the whole organic template or textile template is immersed by the mixed suspensions. After dried at 60° C. for 1 hour (s2), the sol immersed in an organic template, e.g., paper, converts to gel, showing an obvious stiffness increase. The gel-like precursors (105) are then sintered at 1000° C. for 2 hours in atmospheric air (s3) to remove the organic templates. Finally, the PZT ceramic frameworks are obtained. Compared to the organic templates, the sintered PZT ceramic frameworks keep similar morphology but have a ~50% volume shrinkage.

5) Fabricating PZT-PVDF-PDMS piezoelectric (ceramic-polymer) composites: The polyvinylidene fluoride (PVDF) solution dissolved in dimethyl formamide (DMF) is firstly poured onto the surface of PZT ceramic framework until the whole PZT framework is fully infiltrated. After drying at 70° C. for 2 h, the PVDF-coated ceramic-polymer composites are obtained. The uncured polydimethylsiloxane (PDMS) (107) with 10 wt % curing agent is prepared and then vacuumed to remove the bubble. The prepared uncured PDMS is poured onto the surface of PVDF-coated composites until the whole PZT framework is fully infiltrated. After cured at 70° C. for 2 h (s4), the PZT-based ceramic-polymer composites (108) are obtained. A layer of silver film with a 300 nm thickness as the electrodes (109) is then sputtered onto both sides of the fabricated PZT composite (s5). A layer of PDMS film is then spin-coated onto the silver electrodes as the protective layer (110). Finally, the PZT composite is polarized at 85° C. for 1 hour under the electric field of 15 kV/mm and then naturally cooled down to room temperature (s6) to obtain the flexible piezoelectric composite (111).

Figure 2:
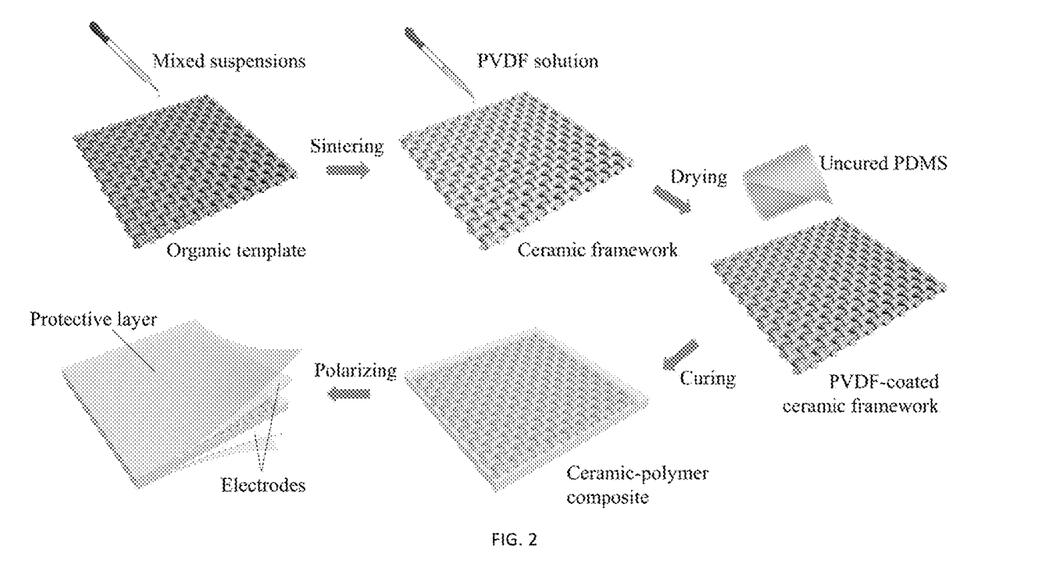
FIG. 2 depicts schematically how the present piezoelectric composite is fabricated including fabricating a three-dimensional ceramic framework and how a ceramic-polymer composite is fabricated according to certain embodiments of the present invention.

FIG. 2 shows the PZT piezoelectric composite, which comprises a 3-D interconnected PZT ceramic framework embedded in flexible PDMS (~200 μm), sputtered silver electrodes (~100 nm) and PDMS protective layer (~100 μm).

Figure 3:
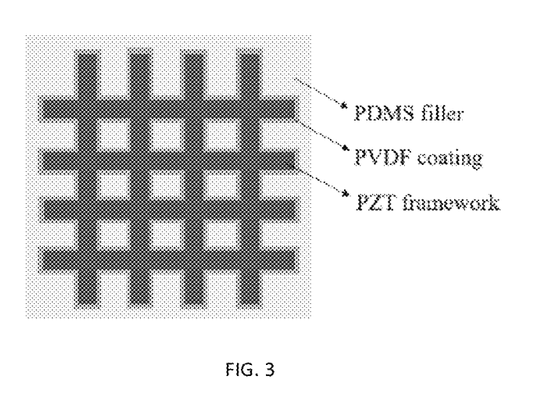
FIG. 3 depicts the structure of the ceramic-polymer composite according to an embodiment of the present invention.

FIG. 3 shows the structure of piezoelectric composite with three main components, including PZT ceramic as the framework, polyvinylidene fluoride (PVDF) as the stiff dielectric coating layer, and polydimethylsiloxane (PDMS) as the soft elastic filler.

Figure 4A:
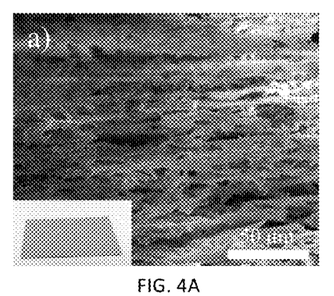
FIG. 4A is an SEM image of the ceramic framework based on a paper template according to an embodiment of the present invention; inset shows an optical image of the paper template.

FIG. 4A shows the cross section scanning electron microscope (SEM) image of PZT ceramic framework based on paper template with 200 μm thickness. The organic templates are removed and a laminar ceramic framework with intense inter-connections is obtained. With Polydimethylsiloxane (PDMS) filled into the PZT ceramic framework, the flexible piezoelectric composites with 3-D interconnected ceramic frameworks are finally obtained.

Figure 4B:
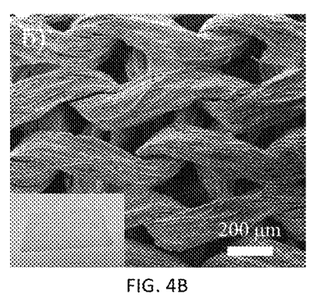
FIG. 4B is an SEM image of the ceramic framework based on a textile template according to an embodiment of the present invention; inset shows an optical image of the textile template.

FIG. 4B shows the scanning electron microscope (SEM) image of PZT ceramic framework based on textile template with 200 μm thickness. The organic templates are removed and a textile-structured ceramic framework with intense inter-connections is obtained. With Polydimethylsiloxane (PDMS) filled into the PZT ceramic framework, the flexible piezoelectric composites with 3-D interconnected ceramic frameworks are finally obtained.

Figure 4C:
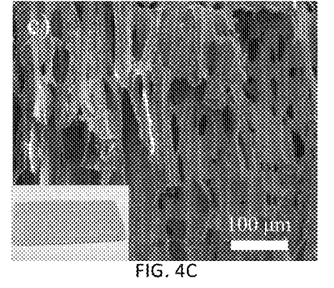
FIG. 4C is an SEM image of the ceramic framework based on a wood template according to an embodiment of the present invention; inset shows an optical image of the wood template.
Figure 4D:
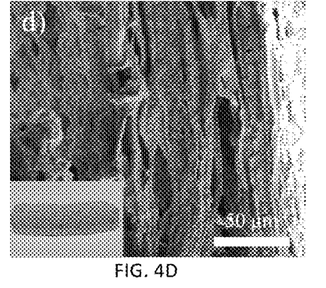
FIG. 4D is an SEM image of the ceramic framework based on a bamboo template according to an embodiment of the present invention; inset shows an optical image of the bamboo template.

FIGS. 4C and 4D show the scanning electron microscope (SEM) images of PZT ceramic framework based on wood and bamboo templates. The organic templates are removed and a textile-structured ceramic framework with intense inter-connections is obtained. With Polydimethylsiloxane (PDMS) filled into the PZT ceramic framework, the flexible piezoelectric composites with 3-D interconnected ceramic frameworks are finally obtained.

Figure 5A:
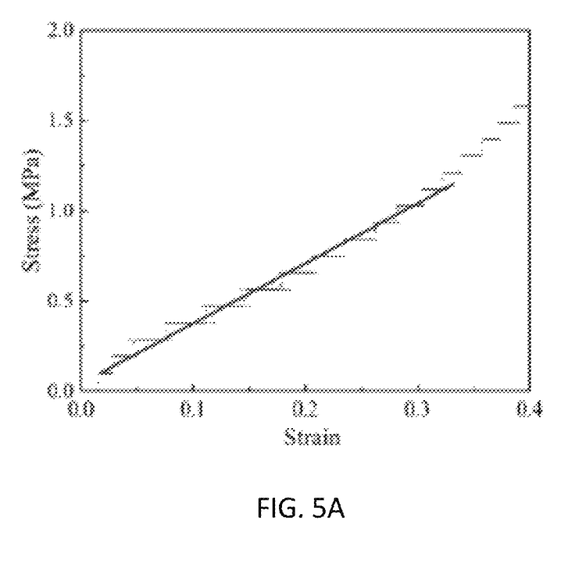
FIG. 5A shows Young's modulus characterization of the piezoelectric composite according to an embodiment of the present invention.
Figure 5B:
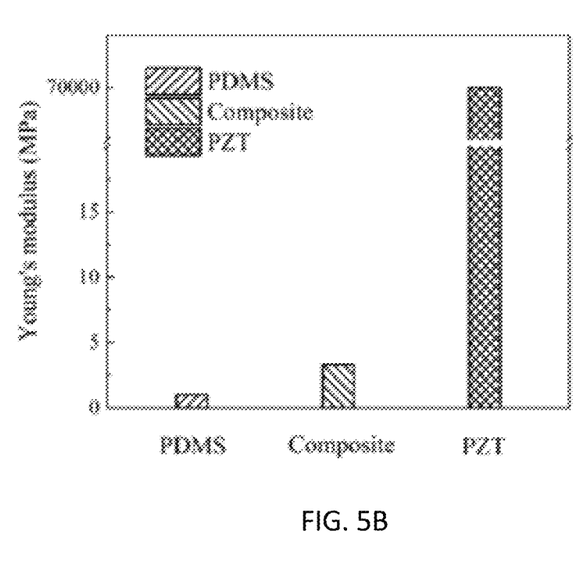
FIG. 5B shows Young's modulus characterization of the piezoelectric composite according to an embodiment of the present invention FIG. 6A schematically depicts how a tapping test is conducted on the piezoelectric composite according to an embodiment of the present invention.

FIG. 5A shows the Young's modulus characterization of PZT piezoelectric composite based on paper template, three different specimens under the same fabrication approach are selected. The Young's modulus of the PZT piezoelectric composite (PZT and PDMS with a mass ratio of 2:1) is characterized as ~3.33 MPa, which is significantly lower than PZT ceramic (~70 GPa), as shown in FIG. 5B. The relatively low Young's modulus and high fracture limit allow the PZT piezoelectric composite to achieve different deformations without cracks.

Figure 6A:
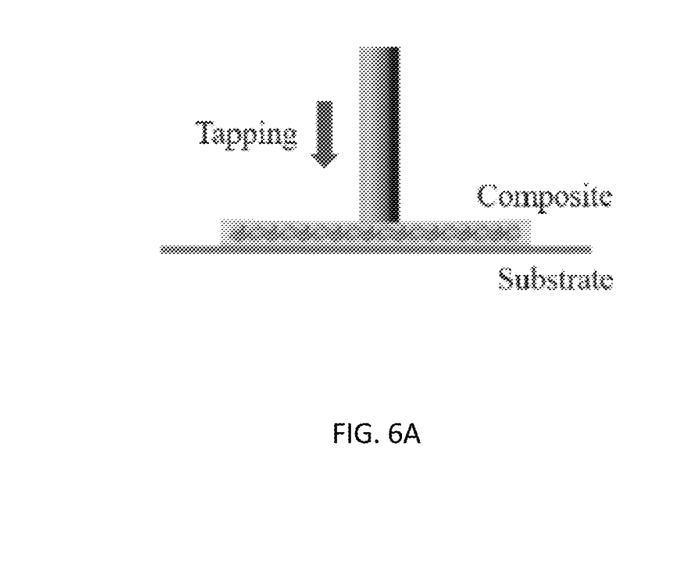
Figure 6B:
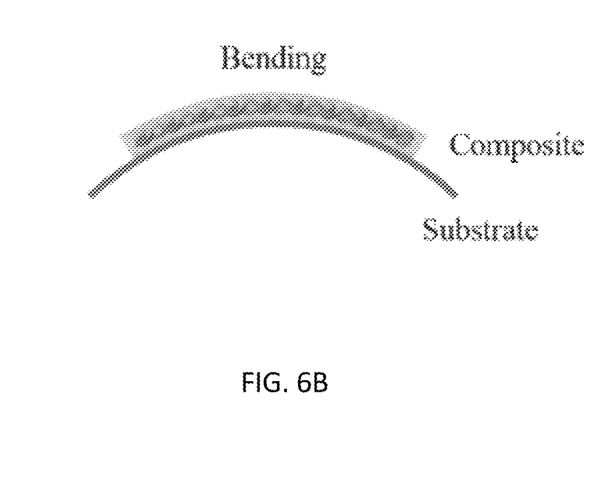
FIG. 6B schematically depicts how a bending test is conducted on the piezoelectric composite according to an embodiment of the present invention

To obtain the piezoelectric responses of the PZT piezoelectric composite under different deformation modes, a series of piezoelectric tests have been designed. FIG. 6A shows the illustration of the tapping test which is conducted by a vibration generator, with a controlled oscillation frequency and taping force. The taping force is adjusted by the distance between the taping pillar and sample surface which can be detected and quantified by mechanical force sensors. FIG. 6B shows the illustration of the bending test, the sample is attached to PI film with 200 μm thickness. Two ends of the PI film are fixed. When changing the distance of the two ends, the bending test with predetermined curve radius can be achieved. The piezoelectric output voltage and current are measured by a digital oscilloscope (Rohde & Schwarz RTE1024) and a low-noise current preamplifier (Stanford Research SR570), respectively.

Figure 7A:
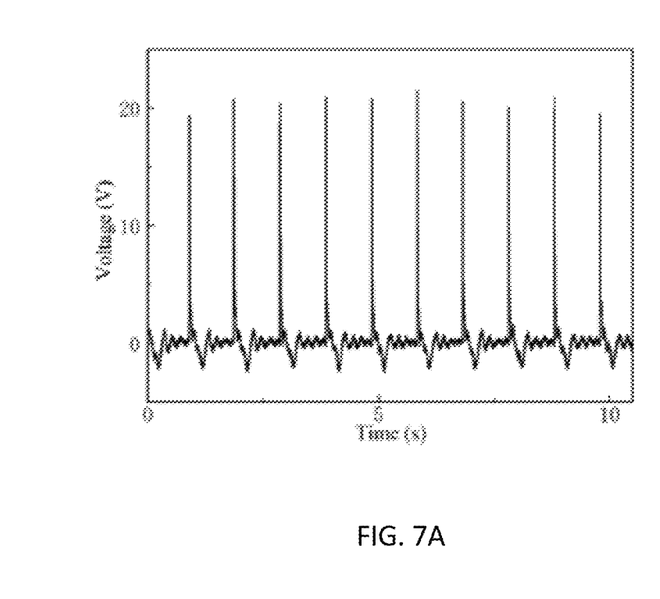
FIG. 7A shows piezoelectric response of the piezoelectric composite based on a paper template under a tapping force.
Figure 7B:
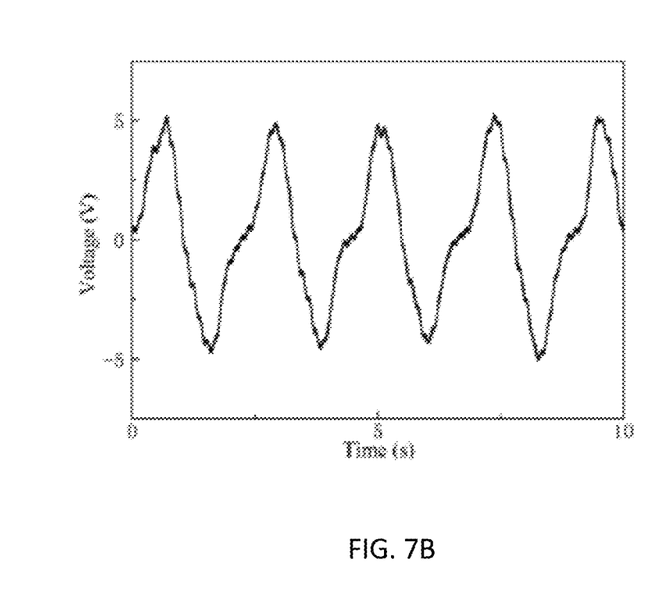
FIG. 7B shows piezoelectric response of the piezoelectric composite based on a paper template under a bending force.

FIGS. 7A-7B show the piezoelectric response of PZT piezoelectric composite based on a paper template with 200 μm thickness. In the tapping mode (FIG. 7A), when a compressive force is loaded under a tapping process with a frequency of 1 Hz, high open-circuit voltage output occurs. Under 10 N applied tapping force, the output voltage reaches 20 V, which are superior to PZT composites previously reported. In the bending mode (FIG. 7B), a PI film substrate with a thickness of ~200 μm is selected, and the output open-circuit voltage is measured under 10 mm curve radii. Once released, the generated output voltages of the PZT piezoelectric composite are recorded. The decrease of the curve radius leads to higher electric output, and the output voltage rises up to 5 V when the curve radius is 10 mm.

Figure 8A:
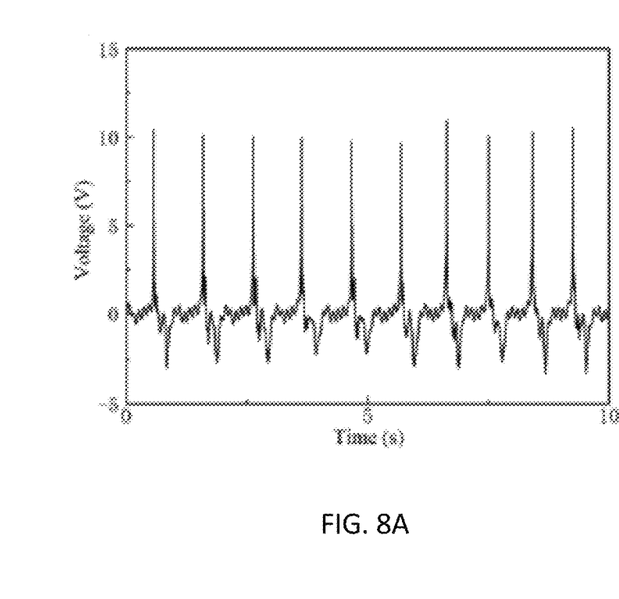
FIG. 8A shows piezoelectric response of the piezoelectric composite based on a textile template under a tapping force.
Figure 8B:
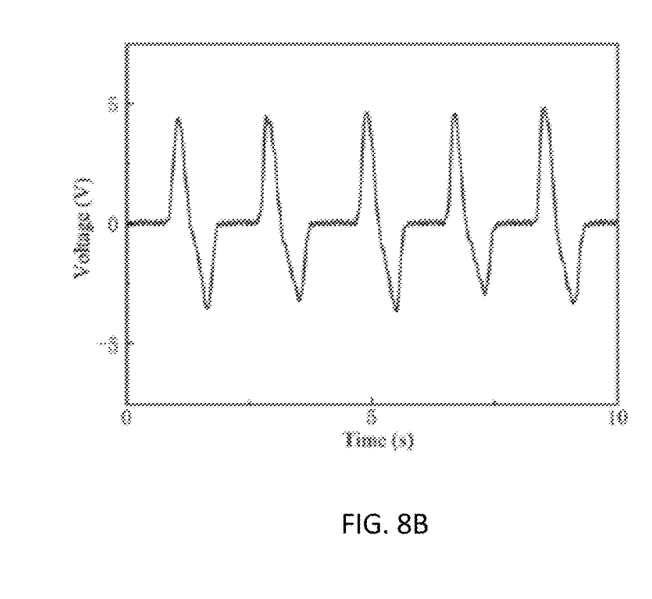
FIG. 8B shows piezoelectric response of the piezoelectric composite based on a textile template under a bending force.

FIGS. 8A-8B shows the piezoelectric response of PZT piezoelectric composite based on textile template with 200 μm thickness. In the tapping mode (FIG. 8A), when a compressive force is loaded under a tapping process with a frequency of 1 Hz, high open-circuit voltage output occurs. Under 10 N applied tapping force, the output voltage reaches 10 V, which are superior to PZT composites previously reported. In the bending mode (FIG. 8B), a PI film substrate with a thickness of ~200 μm is selected, and the output open-circuit voltage is measured under 10 mm curve radii. Once released, the generated output voltages of the PZT piezoelectric composite are recorded. The decrease of the curve radius leads to higher electric output, and the output voltage rise up to 4.5 V when the curve radius is 10 mm.

Figure 9A:
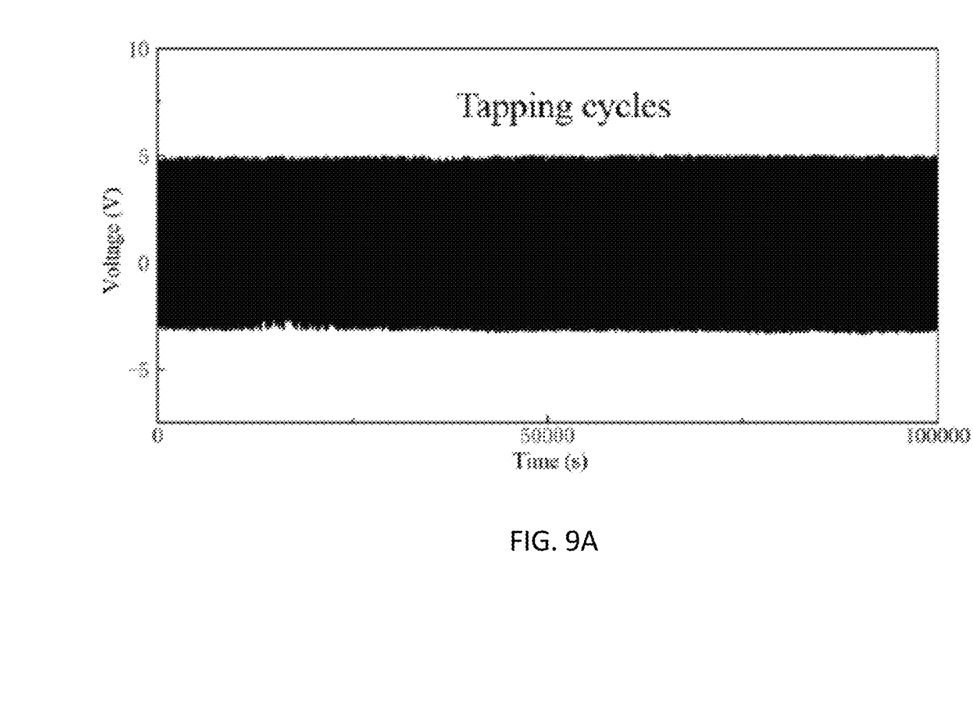
FIG. 9A shows piezoelectric response of the piezoelectric composite based on a paper template under tapping cycles in a longer duration of time.
Figure 9B:
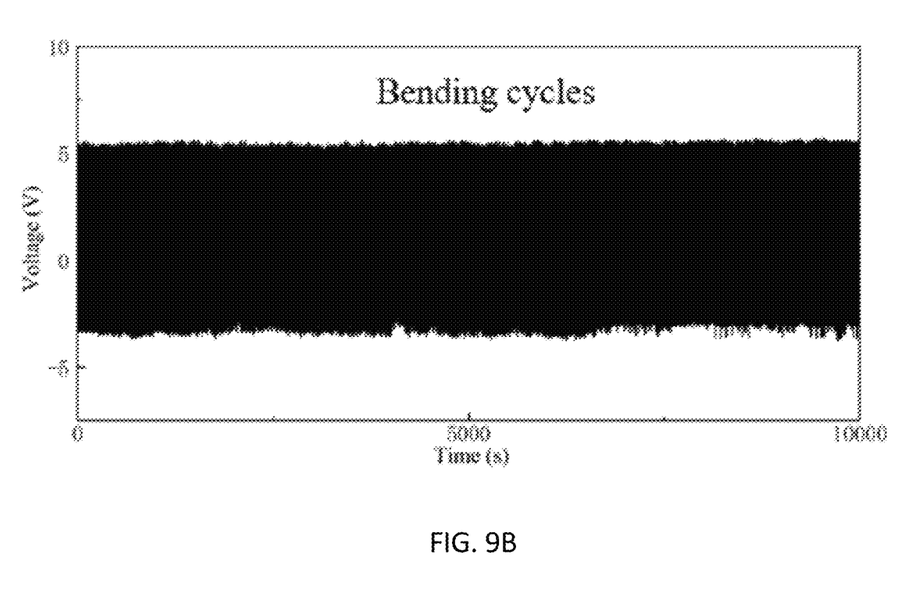
FIG. 9B shows piezoelectric response of the piezoelectric composite based on a paper template under bending cycles in a longer duration of time.

Besides, the flexible PZT piezoelectric composites also have good durability in long-time deformation. FIGS. 9A-9B show the piezoelectric responses of PZT piezoelectric composite based on paper template with 200 μm thickness in long-time deformation cycles. Upon 100,000 tapping cycles, the output voltage of the PZT piezoelectric composite is kept unchanged (FIG. 9A). Upon 10,000 bending-release cycles, the output voltage of the PZT piezoelectric composite also keeps nearly unchanged (FIG. 9B).

Some of the advantages of the present invention are as follows:
1) Due to the excellent piezoelectric framework connectivity originated from porous organic templates, our fabrication method greatly improves the piezoelectric response of the ceramic-polymer composites compared with the traditional ceramic-polymer composites with randomly dispersed ceramic fillers.
2) The addition of ceramic powders into the corresponding sol solutions in the preparation process improves the density of effective piezoelectric materials compared with the methods based on conventional sol-gel method.
3) The various organic templates provide the piezoelectric composites with customizable b 3D interconnected ceramic frameworks, which allows the piezoelectric composites to have anisotropic piezoelectric responses under different forces.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

INDUSTRIAL APPLICABILITY

The high piezoelectricity and flexibility of the present invention allow the piezoelectric composites with b 3D interconnected ceramic framework to work as high-performance energy harvesters and self-powered sensors for portable devices, micro-robotics, and human body monitoring, etc.

The present preparation method of fabricating the porous ceramic framework through the addition of ceramic powders with the corresponding sol solutions can also be applied into other ceramic-polymer composites, achieving excellent mechanical flexibility without decreasing the original functional properties.

The various ceramic frameworks based on customizable organic templates allow the piezoelectric composites to have anisotropic piezoelectric responses, working as self-powered pressure sensors through combining the $d_{33}$, $d_{31}$ and $d_{15}$ coefficients to detect transverse, longitudinal, and shear loads. Moreover, the anisotropic piezoelectricity also allows the composite to be used in flexible energy harvester and the actuation of soft robotics.

The invention claimed is:

1. A flexible piezoelectric composite comprising:
a polymer matrix including at least two polymers and having a low Young's modulus of less than 10 MPa and a permittivity of less than 10;
a porous organic template selected from paper, textile, wood, bamboo, or any organic template having a relatively permittivity of 500 to 7,000 and average pore size of about 10 to 300 μm filled with at least one surface-modified piezoelectric element to form a three-dimensional interconnected ceramic framework such that said polymer matrix after being subject to sintering followed by curing forms a ceramic-polymer composite with equal to or less than 50% volume shrinkage with respect to initial volume of the three-dimensional interconnected ceramic framework and the polymer matrix before said sintering and curing;
at least a pair of electrodes sandwiching the ceramic-polymer framework and subsequently stacking a protective layer on each of the pair of electrodes,
wherein one of the at least two polymers in the polymer matrix is relatively less stiff than the other such that the relatively less stiff polymer serves as an elastic filler whereas the relatively stiffer polymer serves as a mechanical support of the ceramic-polymer framework, and
wherein the flexible, piezoelectric composite is configured to receive an electric field greater than coercive field of the three-dimensional interconnected ceramic framework so as to remain the composite piezoelectrically active.

2. The composite of claim 1, wherein the three-dimensional interconnected ceramic framework to the polymer matrix after sintering is in a mass ratio of more than 2:1.

3. The composite of claim 1, wherein the resulting composite has an elastic modulus of less than 20 MPa, a thickness of more than 100 μm, and a 3-3 connectivity pattern.

4. The composite of claim 1, wherein the relatively less stiff polymer of the at least two polymers of the polymer matrix comprises polydimethylsiloxane (PDMS).

5. The composite of claim 1, wherein the relatively stiffer polymer of the at least two polymers of the polymer matrix comprises polyvinylidene fluoride (PVDF).

6. The composite of claim 1, wherein the at least one piezoelectric element of the three-dimensional interconnected ceramic framework comprises lead-based piezoelectric ceramics, $BaTiO_3$ (BTO), zinc oxide (ZnO), and piezoelectric single crystals.

7. The composite of claim 6, wherein the lead-based piezoelectric ceramics comprises lead zirconate titanate (PZT).

8. The composite of claim 6, wherein said piezoelectric single crystals comprise lead magnesium niobite-lead titanate (PMN-PT), LiNbO$_3$ (LN), and [111]-oriented tetragonal Pb(In$_{1/2}$Nb$_{1/2}$O$_3$)—Pb(Mg$_{1/3}$Nb$_{2/3}$O$_3$)—PbTiO$_3$ (PIN-PMN-PT).

9. The composite of claim 7, wherein lead:zirconate: titanate has a molar ratio of 1:0.52:0.48.

10. A method of fabricating the flexible piezoelectric composite of the claim 1, the method comprising:
  providing a sol solution of piezoelectric element;
  providing surface-modified piezoelectric element powders;
  mixing the sol solution and the surface-modified piezoelectric element powders in a ratio such that a well-dispersed suspension of piezoelectric element mixture is obtained;
  adding the well-dispersed suspension of piezoelectric element mixture dropwise to a porous organic template selected from wood, paper, textile, bamboo, or any organic template having a relatively permittivity of 500 to 7,000 and average pore size of about 10 to 300 μm until the porous organic template is substantially immersed into the suspension of piezoelectric element mixture;
  drying the suspension such that the sol immersed into the pores of the organic template is converted into a gel;
  sintering the dried organic template dispersed with the piezoelectric element to obtain a three-dimensional interconnected piezoelectric-ceramic framework;
  providing and adding a solution of polyvinylidene fluoride on the three-dimensional interconnected piezoelectric-ceramic framework followed by drying to form a coating of polyvinylidene fluoride on the framework;
  providing a solution of polydimethylsiloxane and adding thereof on the surface of the polyvinylidene fluoride-coated three-dimensional interconnected piezoelectric-ceramic framework until the three-dimensional interconnected piezoelectric-ceramic framework is fully infiltrated with the solution of polydimethylsiloxane;
  curing the three-dimensional interconnected piezoelectric-ceramic framework fully infiltrated with the solution of polydimethylsiloxane to obtain a piezoelectric ceramic-polymer composite.

11. The method of claim 10, wherein the sol solution of piezoelectric element is provided by mixing a sol solution of piezoelectric element having a final formula of Pb(Zr$_{0.52}$Ti$_{0.48}$)O$_3$ with lead (II) acetate trihydrate, acetic acid, zirconium (IV) propoxide and titanium (IV) butoxide as the starting materials, wherein the lead (II) acetate trihydrate is added in at least 20% excess by mass into the acetic acid under vigorous stirring at 70° C. until the lead (II) acetate trihydrate is fully dissolved, followed by cooling to room temperature and adding zirconium (IV) propoxide and titanium (IV) butoxide dropwise into the solution of lead (II) acetate trihydrate in acetic acid under stirring, wherein ultrasonic processing is applied under said stirring.

12. The method of claim 11, wherein the sol solution of piezoelectric element has a final concentration of 2M with a molar ratio of lead:zirconium:titanium in 1.2:0.52:0.48.

13. The method of claim 10, wherein said providing the surface-modified piezoelectric element powders comprises adding piezoelectric element powders including PZT powders into distilled water followed by adding polyethyleneimine (PEI) dropwise into the distilled water containing the piezoelectric element powders under stirring, centrifuging the mixture of PZT powders and PEI, collecting the solid phase after centrifugation, and washing the collected solid phase several times to obtain the surface-modified piezoelectric element powders.

14. The method of claim 10, wherein the sol solution of piezoelectric element and the surface-modified piezoelectric element powders are mixed in 1:1 mass ratio.

15. The method of claim 10, wherein said drying of the well-dispersed suspension of piezoelectric element mixture dropwise to a porous organic template is at about 60° C. and for an hour until the sol is converted into the gel.

16. The method of claim 10, wherein said sintering is at about 1,000° C. and for two hours under atmospheric pressure.

17. The method of claim 10, wherein said curing is at about 70° C. for about two hours.

18. The method of claim 10, further comprising sandwiching at least two electrodes each on each surface of the piezoelectric ceramic-polymer composite, followed by stacking a protective layer on each of the at least two electrodes to form an assembly in order to obtain the flexible piezoelectric composite.

19. The method of claim 18, wherein the at least two electrodes comprise silver.

20. The method of claim 18, further comprising polarizing the assembly at about 85° C. for about an hour.

\* \* \* \* \*